(12) United States Patent  
Qin et al.

(10) Patent No.: US 8,802,533 B1  
(45) Date of Patent: Aug. 12, 2014

(54) SEMICONDUCTOR DEVICE AND METHOD OF MANUFACTURING THE SAME

(75) Inventors: Changliang Qin, Beijing (CN); Huaxiang Yin, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/989,297

(22) PCT Filed: Jul. 30, 2012

(86) PCT No.: PCT/CN2012/709352  
§ 371 (c)(1),  
(2), (4) Date: May 23, 2013

(87) PCT Pub. No.: WO2014/012272  
PCT Pub. Date: Jan. 23, 2014

(30) Foreign Application Priority Data

Jul. 16, 2012 (CN) .......................... 2012 1 0246830

(51) Int. Cl.  
*H01L 21/336* (2006.01)  
*H01L 29/66* (2006.01)  
*H01L 29/78* (2006.01)

(52) U.S. Cl.  
CPC ........ *H01L 29/7833* (2013.01); *H01L 29/6659* (2013.01)  
USPC ............ 438/300; 257/344; 257/408; 257/385

(58) Field of Classification Search  
USPC ........................... 257/344, 408, 385; 438/300  
See application file for complete search history.

(56) References Cited

U.S. PATENT DOCUMENTS

| | | | |
|---|---|---|---|
| 7,812,394 B2* | 10/2010 | Murthy et al. | 257/337 |
| 2007/0093033 A1* | 4/2007 | Wang et al. | 438/303 |
| 2013/0230952 A1* | 9/2013 | Wang et al. | 438/199 |
| 2013/0299910 A1* | 11/2013 | Cheng et al. | 257/368 |

* cited by examiner

*Primary Examiner* — Phat X Cao  
(74) *Attorney, Agent, or Firm* — Kinney & Lange, P.A.

(57) ABSTRACT

A transistor device comprising epitaxial LDD and Halo regions and a method of manufacturing the same are disclosed. According to embodiments of the present disclosure, the method may comprise: forming a gate stack on a semiconductor substrate; forming a gate spacer which covers the top of the gate stack and sidewalls of the gate stack; forming source/drain grooves; epitaxially growing a Halo material layer in the source/drain grooves, wherein the Halo material layer has a first doping element therein; epitaxially growing source/drain regions which apply stress to a channel region of the device, wherein the source/drain regions have a second doping element, opposite in conductivity to the first doping element, therein; isotropically etching the source/drain regions to remove portions of the source/drain regions, wherein the etching also removes portions of the Halo material layer directly under the gate spacer and extends to the channel region to some extent, wherein remaining portions of the Halo material layer constitute Halo regions of the device; and epitaxially growing an LDD material layer to form LDD regions of the device.

14 Claims, 3 Drawing Sheets

SEMICONDUCTOR DEVICE AND METHOD OF MANUFACTURING THE SAME

CROSS-REFERENCE TO RELATED APPLICATION(S)

The present application claims priority to Chinese Application No. 201210246830.3, entitled "SEMICONDUCTOR DEVICE AND METHOD OF MANUFACTURING THE SAME," filed on Jul. 16, 2012, which is incorporated herein by reference in its entirety.

TECHNICAL FIELD

The present disclosure relates to the field of semiconductor devices and manufacture thereof, and particularly, to a transistor device comprising epitaxial LDD and Halo regions and a method of manufacturing the same.

BACKGROUND

After the semiconductor integrated circuit technology reaches the 90 nm node and beyond, it is becoming more and more challenging to maintain or even improve performances of transistor devices. At present, the strained silicon technology has become a fundamental one, which improves performances of MOSFET devices by suppressing short channel effects and enhancing the mobility of carriers. For a PMOS device, it is common to form grooves in source and drain regions and then epitaxially grow SiGe therein, which applies compressive stress to press a channel region, so as to improve the performances of the PMOS device. Likewise, for an NMOS device, it is becoming popular to epitaxially grow Si:C in source and drain regions, to achieve the same object. Specifically, various stress applying techniques, such as STI (Shallow Trench Isolation), SPT (Stress Proximity Technique), SiGe embedded source and drain, stressed metallic gate, and Contact Etching Stop Layer (CESL), have been proposed. Further, in small sized devices, it is common to adopt the LDD and Halo processes to suppress hot carrier effects and punch-through between the source and the drain. The LDD and Halo are generally achieved by means of ion implantation followed by annealing.

However, the ion implantation and annealing adopted in the conventional LDD and Halo processes may cause some problems. If the ion implantation is performed before the epitaxy in the source and drain regions, the implantation may cause crystal structures at surfaces of the source and drain grooves damaged, which has negative impacts on the following epitaxy in the source and drain regions. Otherwise, if the implantation is performed after the epitaxy in the source and drain regions, the implantation may cause the stress of the epitaxial layer released, resulting in reduced stress applied by the source and drain regions and thus degraded suppression of the SCE (Short Channel Effects) and DIBL (Drain Induced Barrier Lowering) effects. Further, a high temperature adopted in the annealing process may crystallize an amorphous layer formed by a pre-amorphization process. Furthermore, there is still a possibility that the TED (Transient Enhanced Diffusion) effect occurs and that doped elements cannot achieve a relatively high activation state.

In view of the above, there is a need for a novel transistor and a method of manufacturing the same, so as to more effectively guarantee the performances of the transistor.

SUMMARY

In a further example of the present disclosure, for a PMOS device, the Halo regions may comprise Si or SiGe and the first doping element may comprise an N-type doping element, preferably P; and for an NMOS device, the Halo regions may comprise Si or Si:C and the first doping element may comprise a P-type doping element, preferably B.

According to an aspect of the present disclosure, there is provided a method of manufacturing a semiconductor device, for manufacturing a transistor comprising epitaxial LDD and Halo regions, the method comprising: providing a semiconductor substrate, forming STI arrangements on the semiconductor substrate, and performing well implantation; forming a gate dielectric layer and a gate electrode, and defining a gate pattern; forming a gate spacer which covers the top of the gate electrode and sidewalls of the gate electrode and the gate dielectric layer; forming source/drain grooves; epitaxially growing a Halo material layer in the source/drain grooves, wherein the Halo material layer has a first doping element therein; epitaxially growing source/drain regions which apply stress to a channel region of the transistor, wherein the source/drain regions have a second doping element, opposite in conductivity to the first doping element, therein; isotropically etching the source/drain regions to remove portions of the source/drain regions, wherein the etching also removes portions of the Halo material layer directly under the gate spacer and extends to the channel region to some extent, wherein remaining portions of the Halo material layer constitute the Halo regions of the transistor; epitaxially growing an LDD material layer to form the LDD regions of the transistor; and forming source/drain contacts.

In an example of the present disclosure, the Halo regions each may have a thickness of 1 nm-100 nm, preferably 1 nm-10 nm.

In a further example of the present disclosure, for a PMOS device, the Halo regions may comprise Si or SiGe and the first doping element may comprise an N-type doping element, preferably P; and for an NMOS device, the Halo regions may comprise Si or Si:C and the first doping element may comprise a N-type doping element, preferably B.

In a further example of the present disclosure, the Halo regions may have a doping concentration of 1E13-1E21 $cm^{-3}$, preferably 1E13-1E15 $cm^{-3}$.

In a further example of the present disclosure, the LDD material layer may have a doping dose lower than that of the source/drain regions. For example, the doping dose of the LDD regions can be 1E13-1E15 $cm^{-3}$, and the doping dose of the source/drain regions can be 1E15-1E20 $cm^{-3}$.

In a further example of the present disclosure, for a PMOS device, the LDD regions may comprise Si or SiGe and can be doped with a P-type doping element, preferably B; and for an NMOS device, the LDD regions may comprise Si or Si:C and can be doped with an N-type doping element, preferably P.

In a further example of the present disclosure, forming the LDD regions may comprise: anisotropically etching exposed portions of the LDD material layer in a self-aligned manner after epitaxially growing the LDD material layer, to reserve only portions of the LDD material layer in the source/drain grooves directly under the gate spacer, wherein the reserved portions constitute the LDD regions; and further epitaxially growing the material for the source/drain regions, to compensate for loss of the source/drain regions in the etching.

Alternatively, forming the LDD regions may comprise: leaving the epitaxially grown LDD material layer as it is, without anisotropically etching it in a self-aligned manner; and further epitaxially growing the material for the source/drain regions, to raise the source/drain regions.

According to a further example of the present disclosure, the gate electrode may comprise polysilicon. Further, the gate last process can be adopted. In this process, after formation of the metal silicide, the gate electrode of polysilicon is removed to form a gate void, into which metal is filled to form a metal gate. Alternatively, the gate first process can be adopted. In this process, the gate electrode may comprise metal. Further, the method according to the present disclosure is applicable to the gate first or last process of high-K/metal gate.

According to a further aspect of the present disclosure, there is provided a semiconductor device, comprising a transistor comprising epitaxial LDD and Halo regions, the device comprising: a semiconductor substrate having STI arrangements and well regions formed thereon; a gate stack comprising a gate dielectric layer and a gate electrode; a gate spacer covering the top of the gate electrode and sidewalls of the gate electrode and the gate dielectric layer; source/drain grooves; epitaxially grown Halo regions located in the source/drain grooves, wherein the Halo regions have a first doping element therein; epitaxially grown source/drain regions which apply stress to a channel region of the transistor, wherein the source/drain regions have a second doping element, opposite in conductivity to the first doping element, therein; epitaxially grown LDD regions at least partially located in the source/drain grooves directly under the gate spacer, wherein the LDD regions have a doping dose lower than that of the source/drain regions, and a doping type same as that of the source/drain regions; and source/drain contacts.

In an example of the present disclosure, the Halo regions each may have a thickness of 1 nm-100 nm, preferably 1 nm-10 nm.

In a further example of the present disclosure, for a PMOS device, the Halo regions may comprise Si or SiGe and the first doping element may comprise an N-type doping element, preferably P; and for an NMOS device, the Halo regions may comprise Si or Si:C and the first doping element may comprise a P-type doping element, preferably B.

In a further example of the present disclosure, the Halo regions may have a doping concentration of 1E13-1E21 $cm^{-3}$, preferably 1E13-1E15 $cm^{-3}$.

In a further example of the present disclosure, the doping dose of the LDD regions can be 1E13-1E15 $cm^{-3}$, and the doping dose of the source/drain regions can be 1E15-1E20 $cm^{-3}$.

In a further example of the present disclosure, for a PMOS device, the LDD regions may comprise Si or SiGe and can be doped with a P-type doping element, preferably B; and for an NMOS device, the LDD regions may comprise Si or Si:C and can be doped with an N-type doping element, preferably P.

According to embodiments of the present disclosure, formation of the Halo and LDD regions is achieved by the epitaxy process and the self-aligned anisotropic etching process in combination, and thus it is possible to avoid problems in the prior art where the Halo and LDD regions are formed by ion implantation and annealing. It is possible to completely eliminate damages on crystal structures at surfaces of the source/drain grooves caused by the ion implantation, and thus avoid impacts on the following epitaxy of the material for the source/drain regions, without increasing the amount of photolithography masks and the complexity. Further, according to embodiments of the present disclosure, there is no stress released due to the conventional ion implantation, so the stress in the source/drain regions and thus suppression of the SCE and DIBL effects thereby are guaranteed. Furthermore, according to embodiments of the present disclosure, because there is no annealing following the ion implantation, doped elements in the transistor device can be placed in a relatively high activation state. Also, it is possible to avoid potential crystallization of an amorphous layer formed by a pre-amorphization process and occurrence of the TED (Transient Enhanced Diffusion) effect.

DETAILED DESCRIPTION

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

According to embodiments of the present disclosure, there are provided a semiconductor device and a method of manufacturing the same, especially, a CMOS transistor device comprising epitaxial LDD and Halo regions and a method of manufacturing the same. Structural aspects of the device and a flow of the method will be described in detail with reference to FIGS. 1-7, by way of example.

Figure 7:
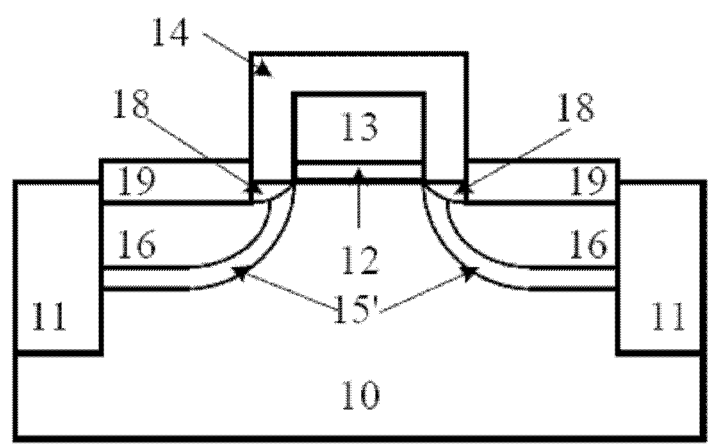

FIG. 7 is a schematic view showing a semiconductor device according to an embodiment of the present disclosure.

The semiconductor device comprises a semiconductor substrate 10 having STI arrangements 11 and well regions (not shown) formed thereon; a gate stack comprising a gate dielectric layer 12 and a gate electrode 13; a gate spacer 14 covering the top of the gate electrode 13 and sidewalls of the gate electrode 13 and the gate dielectric layer 12; source/drain grooves; epitaxially grown Halo regions 15' located in the source/drain grooves, wherein the Halo regions have a first doping element therein; epitaxially grown source/drain regions 16 which apply stress to a channel region of the transistor, wherein the source/drain regions 16 have a second doping element, opposite in conductivity to the first doping element, therein; epitaxially grown LDD regions 18 at least partially located in the source/drain grooves directly under the gate spacer 14, wherein the LDD regions 18 have a doping dose lower than that of the source/drain regions, and a doping type same as that of the source/drain regions; and source/drain contacts 19.

Hereinafter, an exemplary method of manufacturing the semiconductor device will be described in detail.

Figure 1:
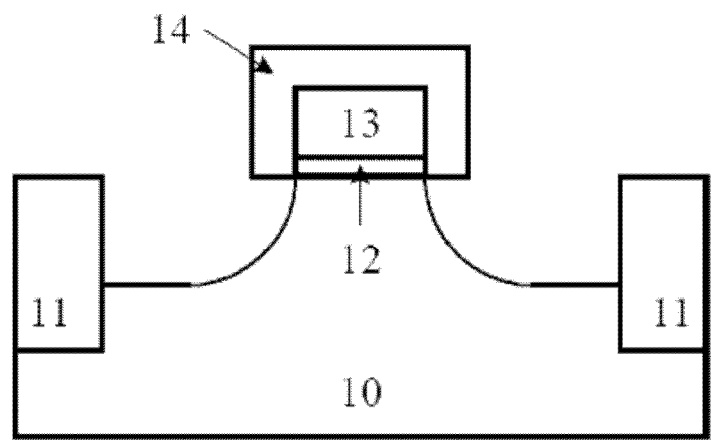
FIGS. 1-7 are schematic views showing a process of manufacturing a transistor comprising epitaxial LDD and Halo regions and structural aspects of the transistor.

Referring to FIG. 1, firstly, on a semiconductor substrate 10, STI (Shallow Trench Isolation) arrangements 11, and also a gate dielectric layer 12, a gate electrode 13, and a gate spacer 14 are formed. Specifically, the semiconductor substrate 10, such as a monocrystalline silicon substrate, is provided. Alternatively, the semiconductor substrate 10 may comprise a Ge substrate or any other suitable substrate. The STI arrangements 11 may be formed on the semiconductor substrate 10 by, for example, applying a photoresist layer on the semiconductor substrate 10 and patterning it into a pattern corresponding to the STI arrangements 11, anisotropically etching the semiconductor substrate 10 to form shallow trenches, and then filling the shallow trenches with a dielectric material such as commonly used $SiO_2$. After formation of the STI arrangements 11, well implantation (not shown) can be performed. For a PMOS device, the well implantation is achieve by implanting N-type impurities; while for an NMOS device, the well implantation is achieved by implanting P-type impurities. To form a gate stack comprising the gate dielectric layer 12 and the gate electrode 13, a thin film layer of a high-K gate dielectric material may be deposited on a surface of the substrate 10. The high-K gate dielectric material has a higher relative permittivity than $SiO_2$, and thus is more beneficial to performances of the transistor device. The high-K gate dielectric material may comprise metal oxide, metal aluminate, and the like, such as $HfO_2$, $ZrO_2$, $LaAlO_3$. The gate dielectric layer 12 should be as thin as possible, preferably with a thickness of about 0.5-10 nm, while keeping its gate insulation property, and can be formed by deposition such as CVD. After formation of the gate dielectric layer 12, a material for the gate electrode 13 is deposited. The gate electrode 13 may comprise polysilicon, metal, metal silicide, and the like. In the gate first process, the gate electrode 13 generally comprises metal or metal silicide; while in the gate last process, the gate electrode 13 generally comprises polysilicon, which is replaced with metal or metal silicide after formation of other parts of the transistor device. After that, a photoresist layer is applied and then subjected to photolithography to define a gate pattern. Then, the gate electrode 13 and the gate dielectric layer 12 are sequentially etched according to the gate pattern. Next, the gate spacer 14 is formed by, for example, depositing a material for the spacer on the substrate 10, such as $SiO_2$ and $Si_3N_4$, by means of a deposition process with a good conformality so that it covers the gate electrode 13 and the gate dielectric layer 12 with a desired thickness, and then removing portions of the spacer material on the surface of the substrate so that the spacer material is left only on top of the gate electrode 13 and on sidewalls of the gate electrode 13 and the gate dielectric layer 12. As a result, the gate spacer 14 surrounds the entire gate stack. The gate spacer 14 may have a thickness of about 1 nm-100 nm, preferably 5 nm-50 nm. Subsequently, the semiconductor substrate 10 is anisotropically etched in a self-aligned manner with the STI arrangements 11, the gate electrode 13 and the gate spacer 14 as a mask, to form source/drain grooves.

Figure 2:
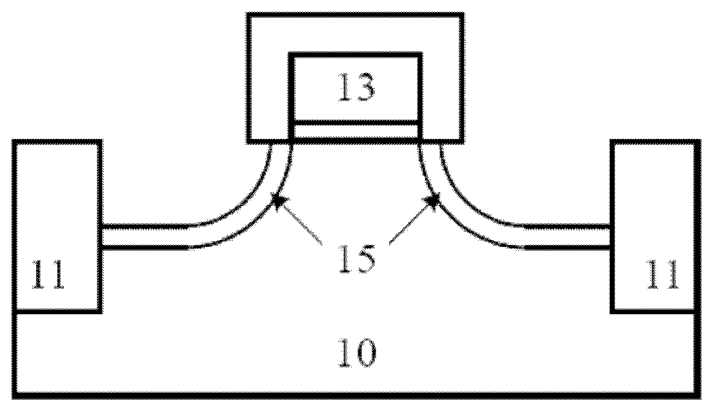

Next, referring to FIG. 2, a Halo material layer 15 is epitaxially grown in the source/drain grooves. The Halo material layer 15 may comprise Si or SiGe (for a PMOS device), or alternatively Si or Si:C (for an NMOS device). The Halo material layer 15 may have a first doping element doped therein, with a doping concentration of about $1E13$-$1E21$ $cm^{-3}$, preferably $1E13$-$1E15$ $cm^{-3}$.

Figure 3:
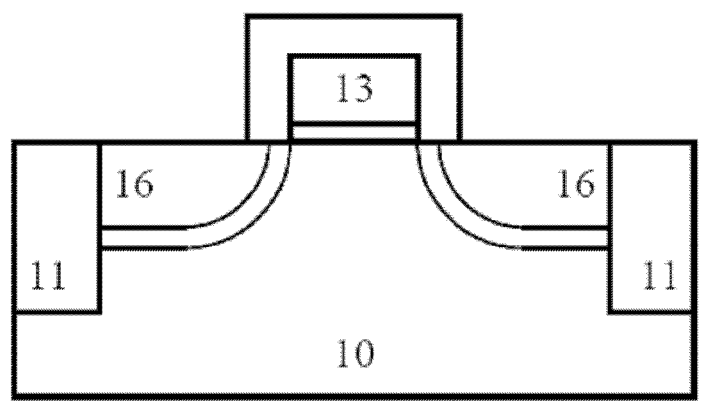

Then, source/drain regions 16 is epitaxially grown selectively, as shown in FIG. 3. The source/drain regions 16 may comprise Si or SiGe (for a PMOS device), or alternatively Si or Si:C (for an NMOS device), to apply stress to a channel region of the MOS device so as to enhance the mobility of carriers. The source/drain regions can be doped in-situ with, for example, B (for a PMOS device) or P (for an NMOS device) into appropriate source/drain doping, while being epitaxially grown. The source/drain regions 16 may be configured to apply compressive stress for a PMOS device, while tensile stress for an NMOS device. Here, the source/drain regions 16 may have a second doping element doped therein, which has a conductivity type opposite to the first doping element. That is, if the source/drain regions 16 are doped with P-type impurities (for a PMOS device), then the Halo material layer 15 is be doped with N-type impurities such as P; or otherwise, if the source/drain regions 16 are doped with N-type impurities (for an NMOS device), then the Halo material layer 15 is be doped with P-type impurities such as B.

Figure 4:
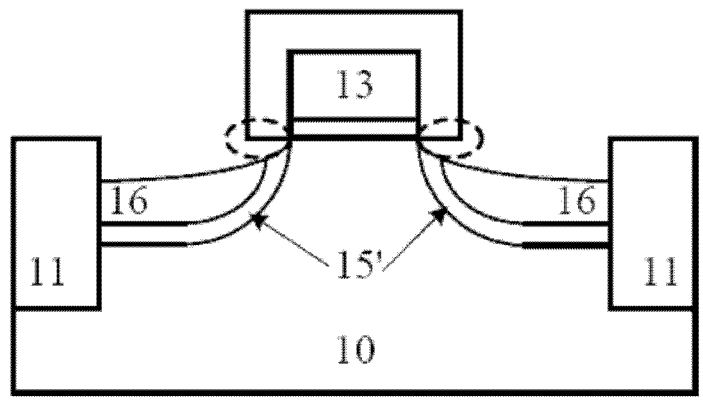

Next, referring to FIG. 4, portions of the source/drain regions 16 are removed by anisotropic etching. At the same time, portions of the Halo material layer at SDE (Source Drain Extension) regions (indicated by dashed-line circles in the drawing) are also etched away. The etching drills towards the channel region underlying the gate electrode to remove the portions of the Halo material layer directly under the gate spacer 14, and extends to the channel region to some extent. Here, removal of the portions of the Halo material layer at the SDE regions will prevent a serial resistance at the SDE regions from being too large. The Halo material layer with the portions etched away constitutes Halo regions 15' of the transistor device, with a thickness of about 1 nm-100 nm, preferably 1 nm-10 nm.

Figure 5:
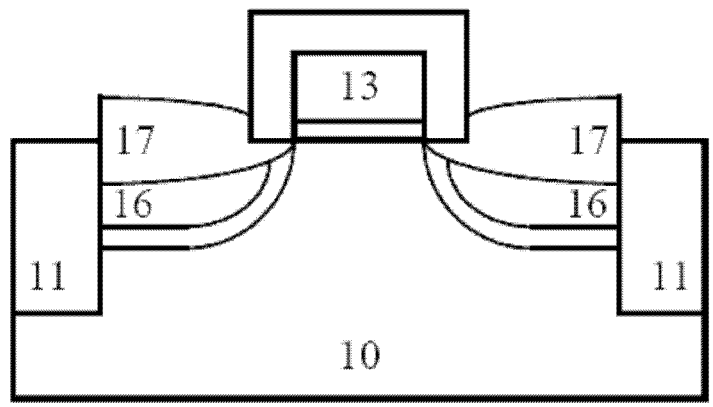
Figure 6:
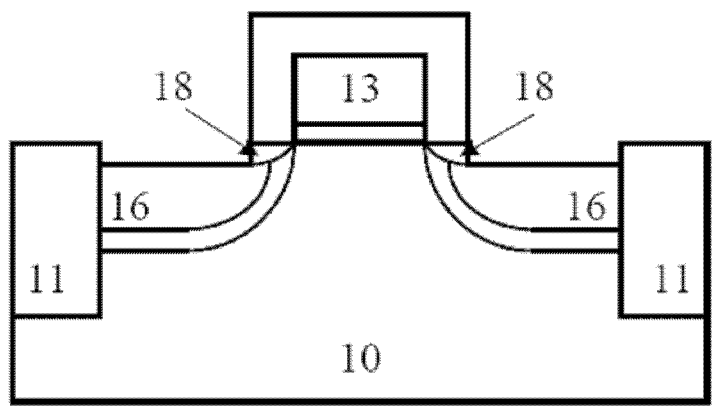

Then, referring to FIG. 5, an LDD material layer 17 is epitaxially grown to form LDD regions of the transistor device. Here, the LDD material layer 17 may have the same second doping element as the source/drain regions 16. For example, for a PMOS device, the LDD regions may comprise Si or SiGe, doped with B; while for an NMOS device, the LDD regions may comprise Si or Si:C, doped with P. However, the LDD material layer 17 may have a doping dose lower than that of the source/drain regions 16. For example, the doping dose in the source/drain regions 16 may be about $1E15$-$1E20$ $cm^{-3}$, and the doping dose in the LDD material layer 17 may be about $1E13$-$1E15$ $cm^{-3}$. The LDD regions may be formed by directly epitaxially growing the LDD material layer 17 in the source/drain grooves. That is, after epitaxy of the LDD material layer, self-aligned anisotropic etching is not performed. After that, the material for the source/drain regions is further epitaxially grown to raise the source/drain regions, so as to reduce a contact resistance. In this way, the LDD regions are positioned at least partially in the source/drain grooves directly under the gate spacer 14 (referring to the example shown in FIG. 5). Alternatively, the LDD regions may be formed as follows. Referring to FIG. 6, after the LDD material layer 17 is epitaxially grown, exposed portions thereof may be anisotropically etched in a self-aligned manner. Due to presence of the gate spacer 14, portions of the LDD material layer in the source/drain grooves directly under the gate spacer 14 are reserved. The reserved portions of the LDD material layer constitute the LDD regions 18 of the transistor device. After that, the material for the source/drain regions is further epitaxially grown in the source/drain grooves, so as to compensate for loss of the source/drain regions in the etching. In this way, the LDD regions are entirely positioned in the source/drain grooves directly under the gate spacer 14.

Thus, the Halo regions and the LDD regions are achieved by means of epitaxy. Because formation of the Halo and LDD regions is achieved by the epitaxy process and the self-aligned anisotropic etching process in combination, it is possible to avoid problems in the prior art where the Halo and LDD regions are formed by ion implantation and annealing. It is possible to completely eliminate damages on crystal structures at the surfaces of the source/drain grooves caused by the ion implantation, and thus avoid impacts on the following epitaxy of the material for the souce/drain regions, without increasing the amount of photolithography masks and the complexity. Further, according to embodiments of the present disclosure, there is no stress released due to the conventional ion implantation, so the stress in the source/drain regions and thus suppression of the SCE and DIBL effects thereby are guaranteed. Furthermore, according to embodiments of the present disclosure, because there is no annealing following the ion implantation, the doped elements in the transistor device can be placed in a relatively high activation state. Also, it is possible to avoid potential crystallization of an amorphous layer formed by a pre-amorphization process and occurrence of the TED (Transient Enhanced Diffusion) effect.

After that, the manufacture of the transistor device can continue conventionally. Referring to FIG. 7, source/drain contacts of metal silicide 19 can be formed. The metal silicide may comprise NiSi, NiSiGe, TiSi, TiSiGe, and the like.

After that, interconnection lines can be manufactured, if in the gate first process. Alternatively, the already formed gate electrode of polysilicon can be removed and a gate electrode of metal or metal silicide can be formed instead, and then interconnection lines can be manufactured, if in the gate last process.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method of manufacturing a semiconductor device, the method comprising:
   forming a gate stack on a semiconductor substrate;
   forming a gate spacer which covers the top of the gate stack and sidewalls of the gate stack;
   forming source/drain grooves;
   epitaxially growing a Halo material layer in the source/drain grooves, wherein the Halo material layer has a first doping element therein;
   epitaxially growing source/drain regions which apply stress to a channel region of the device, wherein the source/drain regions have a second doping element, opposite in conductivity to the first doping element, therein;
   isotropically etching the source/drain regions to remove portions of the source/drain regions, wherein the etching also removes portions of the Halo material layer directly under the gate spacer and extends to the channel region to some extent, wherein remaining portions of the Halo material layer constitute Halo regions of the device; and
   epitaxially growing an LDD material layer to form LDD regions of the device.

2. The method according to claim 1, wherein the LDD material layer has a doping dose lower than that of the source/drain regions.

3. The method according to claim 1, wherein forming the LDD regions comprises:
   anisotropically etching exposed portions of the LDD material layer in a self-aligned manner after epitaxially growing the LDD material layer, to reserve only portions of the LDD material layer in the source/drain grooves directly under the gate spacer, wherein the reserved portions constitute the LDD regions; and
   further epitaxially growing the material for the source/drain regions.

4. The method according to claim 1, further comprising:
   further epitaxially growing the material for the source/drain regions on the epitaxially grown LDD material layer, to raise the source/drain regions.

5. A semiconductor device, comprising:
   a semiconductor substrate;
   a gate stack formed on the semiconductor substrate;
   a gate spacer covering the top of the gate stack and sidewalls of the gate stack;
   source/drain grooves;
   epitaxially grown Halo regions located in the source/drain grooves, wherein the Halo regions have a first doping element therein;
   epitaxially grown source/drain regions which apply stress to a channel region of the device, wherein the source/drain regions have a second doping element, opposite in conductivity to the first doping element, therein; and
   epitaxially grown LDD regions at least partially located in the source/drain grooves directly under the gate spacer, wherein the LDD regions have a doping dose lower than that of the source/drain regions, and a doping type same as that of the source/drain regions.

6. The device according to claim 5, wherein the Halo regions each have a thickness of 1 nm-100 nm.

7. The device according to claim 5, wherein for a PMOS device, the Halo regions comprise Si or SiGe and the first doping element comprises an N-type doping element; and for an NMOS device, the Halo regions comprise Si or Si:C and the first doping element comprises a P-type doping element.

8. The device according to claim 5, wherein the Halo regions have a doping concentration of $1E13$-$1E21$ $cm^{-3}$.

9. The device according to claim 5, wherein the doping dose of the LDD regions is $1E13$-$1E15$ $cm^{-3}$, and the doping dose of the source/drain regions is $1E15$-$1E20$ $cm^{-3}$.

10. The device according to claim 5, wherein for a PMOS device, the LDD regions comprise Si or SiGe and are doped with a P-type doping element; and for an NMOS device, the LDD regions comprise Si or Si:C and are doped with an N-type doping element.

11. The device according to claim 6, wherein the Halo regions each have a thickness of 1 nm-10 nm.

12. The device according to claim 7, wherein the N-type doping element comprises P, and the P-type doping element comprises B.

13. The device according to claim 8, wherein the Halo regions have a doping concentration of $1E13$-$1E15$ $cm^{-3}$.

14. The device according to claim 10, wherein the P-type doping element comprises B, and the N-type doping element comprises P.

* * * * *